(12) United States Patent
Xu et al.

(10) Patent No.: US 8,787,851 B2
(45) Date of Patent: Jul. 22, 2014

(54) SYSTEM AND METHOD FOR QUICKLY POWER AMPLIFIER CONTROL

(71) Applicant: Huawei Device Co., Ltd, Shenzhen (CN)

(72) Inventors: Wei Xu, Shenzhen (CN); Yu Deng, Shanghai (CN)

(73) Assignee: Huawei Device Co., Ltd., Shenzhen (CN)

( * ) Notice: Subject to any disclaimer, the term of this patent is extended or adjusted under 35 U.S.C. 154(b) by 0 days.

(21) Appl. No.: 13/925,394

(22) Filed: Jun. 24, 2013

(65) Prior Publication Data

US 2014/0018022 A1 Jan. 16, 2014

(30) Foreign Application Priority Data

Jul. 10, 2012 (CN) .......................... 2012 1 0236675

(51) Int. Cl.
*H04B 1/04* (2006.01)
*H03C 1/62* (2006.01)

(52) U.S. Cl.
USPC ....................................... 455/127.2; 455/126

(58) Field of Classification Search
USPC ................... 455/126, 127.2–127.3
See application file for complete search history.

(56) References Cited

U.S. PATENT DOCUMENTS

| 2002/0081986 A1 | 6/2002 | Yokoyama |
| 2004/0110475 A1 | 6/2004 | Korol |
| 2006/0140145 A1 | 6/2006 | Ogawa |
| 2009/0154377 A1 | 6/2009 | Tsuda et al. |
| 2011/0130105 A1 | 6/2011 | Chan et al. |

FOREIGN PATENT DOCUMENTS

| CN | 1797961 A | 7/2006 |
| CN | 101207394 A | 6/2008 |
| CN | 102255620 A | 11/2011 |

OTHER PUBLICATIONS

International Search Report and Written Opinion received in Application No. PCT/CN2013/078783 mailed Oct. 10, 2013. 9 pages.

*Primary Examiner* — Lee Nguyen
(74) *Attorney, Agent, or Firm* — Slater & Matsil, L.L.P.

(57) ABSTRACT

Embodiments of the present invention provide a system and method for power amplifier control. Before a fixed gain amplifier is disabled and after an automatic gain controller adjusts gain for the last time, a reference transmit power value is read from the automatic gain controller. A gain level is read from the fixed gain amplifier. The reference transmit power value and the gain level are saved in a storage module. Before the fixed gain amplifier is enabled and after the automatic gain controller adjusts gain for the last time, the reference transmit power value saved in the storage module is written into the automatic gain controller and the gain level saved in the storage module is written into the fixed gain amplifier.

9 Claims, 3 Drawing Sheets

Before a fixed gain amplifier is disabled and after an automatic gain controller adjusts gain for the last time, read a reference transmit power value from the automatic gain controller, read a gain level from the fixed gain amplifier, and save the reference transmit power value and the gain level in a storage module. — 201

Before the fixed gain amplifier is enabled and after the automatic gain controller adjusts gain for the last time, write the reference transmit power value saved in the storage module into the automatic gain controller and write the gain level saved in the storage module into the fixed gain amplifier. — 202

SYSTEM AND METHOD FOR QUICKLY POWER AMPLIFIER CONTROL

CROSS-REFERENCE TO RELATED APPLICATION

This application claims priority to Chinese Patent Application No. 201210236675.7, filed on Jul. 10, 2012, which is hereby incorporated by reference in its entirety.

TECHNICAL FIELD

The present invention relates to the field of wireless communication technologies, and in particular, to a system and method for quickly power amplifier control.

BACKGROUND

Quickly power amplifier control (Quickly Power Amplifier Control, referred to as QPC), as the latest energy-saving technology for a mobile terminal, may immediately enable an uplink power amplifier (Power Amplifier, referred to as PA) to perform final power amplification on a signal to be sent to a base station when a mobile terminal has data to be sent, and promptly disable the uplink PA after the mobile terminal sends data to the base station, thereby reducing power consumption of the uplink PA.

With the QPC in the prior art, to maintain constant transmit power of an existing terminal, an uplink power amplification link for the terminal adopts the scheme that one stage of variable gain amplifier and one stage of fixed gain amplifier are cascaded. Automatic gain control (Automatic Gain Control, referred to as AGC) is used to control the variable gain amplifier and the fixed gain amplifier, and meanwhile closed-loop power control is used to ensure the stable output power of the terminal, that is, a base station controls, according to the received transmit power of the terminal, the transmit power of the terminal by using an air interface message.

In the prior art, after data is transmitted from the terminal to the base station, the uplink PA is directly disabled. An automatic gain controller does not learn that the uplink PA is disabled, and during the period of time when the uplink PA is disabled, continues to increase the transmit power until adjusting the power to a maximum value. When the uplink PA is enabled again, the uplink PA is enabled with gull gain and transmits a signal. As a result, the transmit power of the mobile terminal when the PA is enabled is different from the transmit power of the mobile terminal when the PA is disabled.

SUMMARY

Embodiments of the present invention provide a system and method for quickly power amplifier control, to ensure that the transmit power of a mobile terminal is consistent.

On one hand, an embodiment of the present invention provides a system for quickly power amplifier control, where the system includes:

an automatic gain controller, a variable gain amplifier, a fixed gain amplifier, and a radio frequency antenna that are connected in sequence, where an output end of the fixed gain amplifier is connected to an input end of the automatic gain controller in feedback mode;

a processor, configured to, before the fixed gain amplifier is disabled and after the automatic gain controller adjusts gain for the last time, read a reference transmit power value from the automatic gain controller, read a gain level from the fixed gain amplifier, and save the reference transmit power value and the gain level in a storage module; and the processor, further configured to, before the fixed gain amplifier is enabled and after the automatic gain controller adjusts gain for the last time, write the reference transmit power value saved in the storage module into the automatic gain controller and write the gain level saved in the storage module into the fixed gain amplifier; and the storage module, configured to save the reference transmit power value and the gain level.

On the other hand, an embodiment of the present invention provides a method for quickly power amplifier control, including:

before a fixed gain amplifier is disabled and after an automatic gain controller adjusts gain for the last time, reading a reference transmit power value from the automatic gain controller and reading a gain level from the fixed gain amplifier and saving the reference transmit power value and the gain level in a storage module; and before the fixed gain amplifier is enabled and after the automatic gain controller adjusts gain for the last time, writing the reference transmit power value saved in the storage module into the automatic gain controller and writing the gain level saved in the storage module into the fixed gain amplifier.

With the system and method for quickly power amplifier control provided by the embodiments of the present invention, before the fixed gain amplifier is disabled and after the automatic gain controller adjusts gain for the last time, a reference transmit power value is read from the automatic gain controller and a gain level is read from the fixed gain amplifier; before the fixed gain amplifier is enabled and after the automatic gain controller adjusts gain for the last time, the reference transmit power value saved in the storage module is written into the automatic gain controller and the gain level saved in the storage module is written into the fixed gain amplifier; as a result, the link gain state when the fixed gain amplifier is enabled is consistent with the link gain state before the fixed gain amplifier is disabled, thereby ensuring that the transmit power of an uplink signal is stable with good quality.

BRIEF DESCRIPTION OF DRAWINGS

To illustrate the technical solutions in embodiments of the present invention or in the prior art more clearly, the following briefly introduces the accompanying drawings required for describing the embodiments or the prior art. Apparently, the accompanying drawings in the following description show merely some embodiments of the present invention, and persons of ordinary skill in the art may still derive other drawings from these accompanying drawings without creative efforts.

DESCRIPTION OF EMBODIMENTS

To make the objectives, technical solutions, and advantages of the embodiments of the present invention more clearly, the following clearly describes the technical solutions in the embodiments of the present invention with reference to the accompanying drawings in the embodiments of the present invention. Apparently, the described embodiments are merely a part rather than all of the embodiments of the present invention. All other embodiments obtained by persons of ordinary skill in the art based on the embodiments of the present invention without creative efforts shall fall within the protection scope of the present invention.

Figure 1:
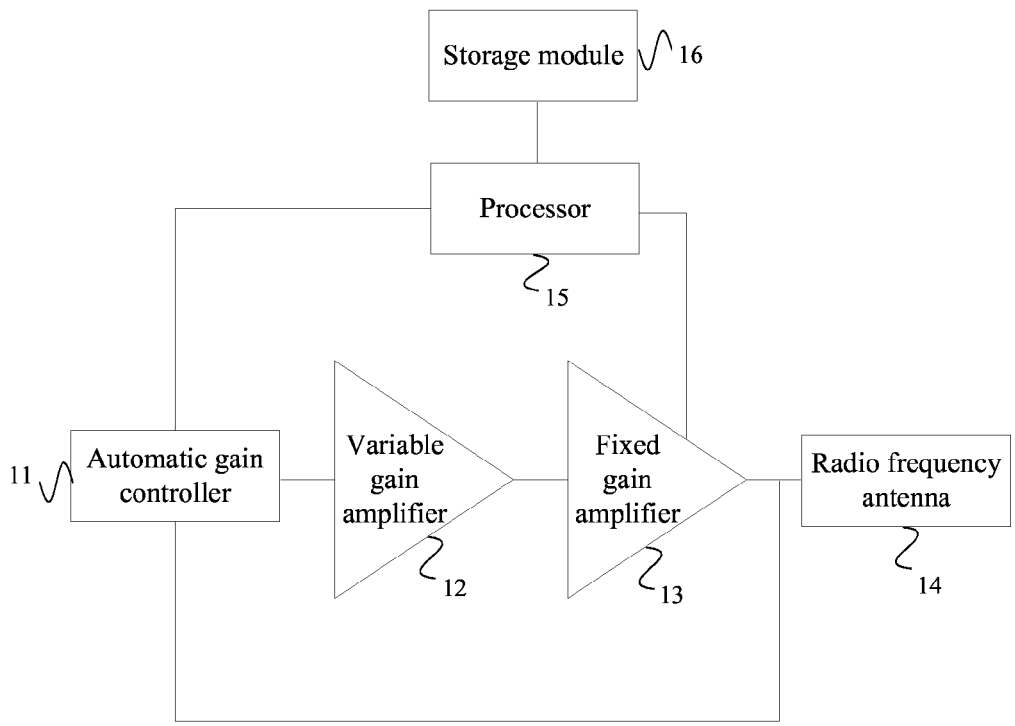
FIG. 1 is a structural schematic diagram of a system for quickly power amplifier control according to an embodiment of the present invention.

FIG. 1 is a structural schematic diagram of a system for quickly power amplifier control according to an embodiment of the present invention. As shown in FIG. 1, a system for quickly power amplifier control includes an automatic gain controller 11, a variable gain amplifier 12, a fixed gain amplifier 13, and a radio frequency antenna 14 that are connected in sequence, where an output end of the fixed gain amplifier 13 is connected to an input end of the automatic gain controller 11 in feedback mode.

Specifically, the system for quickly power amplifier control provided by the embodiment of the present invention may be a closed-loop feedback control system, and the transmit power of a mobile terminal is controlled through the closed-loop feedback control system. The output power of the fixed gain amplifier 13 may be fed back to the automatic gain controller 11, and the automatic gain controller 11 uses the feedback power obtained from the fixed gain amplifier 13, namely, the output power of the fixed gain amplifier 13, as a reference transmit power value of the mobile terminal when transmitting a signal next time. The gain of the variable gain amplifier 12 and the gain of the fixed gain amplifier 13 are automatically adjusted through bias control, thereby ensuring stability of the output power. For example, when the transmit power value of the mobile terminal, namely, the output power of the fixed gain amplifier 13, is less than the reference transmit power value, the automatic gain controller 11 adjusts the gain of the variable gain amplifier 12 and the gain of the fixed gain amplifier 13 to increase the transmit power of the mobile terminal, to make the transmit power to be close to or equal to the reference transmit power value; when the transmit power value of the mobile terminal, namely, the output power of the fixed gain amplifier 13, is greater than the reference transmit power value, the automatic gain controller 11 adjusts the gain of the variable gain amplifier 12 and the gain of the fixed gain amplifier 13 to decrease the transmit power of the mobile terminal, make the transmit power to be close to or equal to the reference transmit power value; as a result, the output power of the mobile terminal remains unchanged or fluctuates in a small range, thereby ensuring that the output power is constant. Especially, the fixed gain amplifier 13 has one to three or even more gain levels, and each gain level corresponds to one fixed amplification gain.

The system for quickly power amplifier control provided by the embodiment of the present invention further includes a processor 15, where the processor 15 is configured to, before the fixed gain amplifier 13 is disabled and after the automatic gain controller 11 adjusts gain for the last time, read a reference transmit power value from the automatic gain controller 11, read a gain level from the fixed gain amplifier 13, and save the reference transmit power value and the gain level in a storage module; and the processor 15 is further configured to, before the fixed gain amplifier 13 is enabled and after the automatic gain controller 11 adjusts gain for the last time, write the reference transmit power value saved in the storage module into the automatic gain controller 11 and write the gain level saved in the storage module into the fixed gain amplifier 13.

Specifically, before the fixed gain amplifier 13 is disabled and after the automatic gain controller 11 adjusts gain for the last time, the professor 15 may read the gain level from a state register of the fixed gain amplifier 13, read the reference transmit power value from a state register of the automatic gain controller, and save the reference transmit power and the gain level in the storage module. Persons skilled in the art may understand that the automatic gain controller and the fixed gain amplifier are not simple circuit components but complex circuit devices, and a state register may be a part of the automatic gain controller and a state register may be a part of the fixed gain amplifier. Meanwhile, the state registers may be set outside the automatic gain controller and the fixed gain amplifier, for storing various information of the automatic gain controller and the fixed gain amplifier.

Before the fixed gain amplifier 13 is enabled and after the automatic gain controller 11 adjusts gain for the last time, the processor 15 may write the reference transmit power value saved in the storage module 16 into the state register of the automatic gain controller 11 and write the gain level saved in the storage module 16 into the state register of the fixed gain amplifier 13. Persons skilled in the art may understand that the logical read location and the logical write location of the automatic gain controller 11 in its state register are the same, and the logical read location and the logical write location of the fixed gain amplifier 13 in its state registers are the same.

The system for quickly power amplifier control according to the embodiment of the present invention further includes the storage module 16, configured to save the reference transmit power value and the gain level.

Specifically, the storage module 16 may be a section of memory that the processor 15 applies for from the system and may be configured to store the gain level read from the fixed gain amplifier 13 and the reference transmit power read from the automatic gain controller 11.

The system for quickly power amplifier control according to the embodiment of the present invention is capable of keeping the output power unchanged or fluctuated in a small range to ensure that the output power is constant, by connecting an output end of the fixed gain amplifier to an input end of the automatic gain controller in feedback mode and using the automatic gain controller to adjust the gain of the variable gain amplifier and the gain of the fixed gain amplifier; is capable of reading the reference transmit power value from the automatic gain controller and reading the gain level from the fixed gain amplifier before the fixed gain amplifier is disabled and after the automatic gain controller adjusts gain for the last time; and is capable of writing the reference transmit power value saved in the storage module into the automatic gain controller and writing the gain level saved in the storage module into the fixed gain amplifier before the fixed gain amplifier is enabled and after the automatic gain controller adjusts gain for the last time, so that the transmit power when the automatic gain controller and the fixed gain amplifier are disabled can be consistent with the transmit power when the automatic gain controller and the fixed gain amplifier are enabled subsequently, so as to ensure that the transmit power of an uplink signal is stable with good quality.

Optionally, during the period of time from the time when the fixed gain amplifier 13 is disabled to the time when the fixed gain amplifier 13 is enabled, the processor 15 is further configured to control the automatic gain controller 11 to temporarily stop working.

Optionally, during the period of time from the time when the fixed gain amplifier 13 is enabled to the time when the fixed gain amplifier 13 is disabled, the processor 15 may control the automatic gain controller 11 to keep in working state.

With the technical solutions provided by the embodiment of the present invention, during the period of time from the time when the fixed gain amplifier is disabled to the time when the fixed gain amplifier is enabled, the automatic gain controller is controlled to temporarily stop working. This not only meets the energy-saving requirement of a QPC technology, but also further reduces power consumption.

Figure 2:
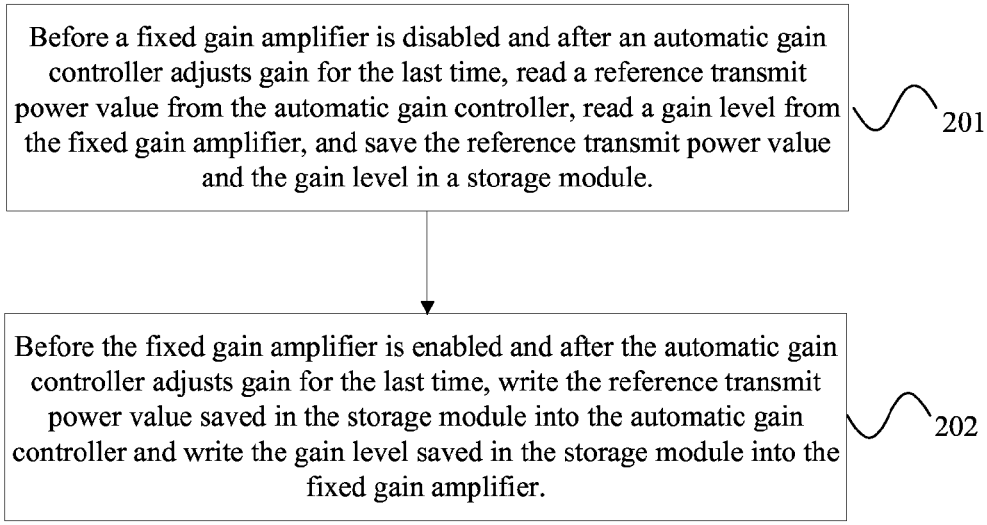
FIG. 2 is a flowchart of a method for quickly power amplifier control according to an embodiment of the present invention.

FIG. 2 is a flowchart of a method for quickly power amplifier control according to an embodiment of the present invention. It should be noted that the method for quickly power amplifier control provided by the embodiment of the present invention is based on the system for quickly power amplifier control provided by the embodiment of the present invention. As shown in FIG. 2, the method for quickly power amplifier control includes the following steps:

Step 201: Before a fixed gain amplifier is disabled and after an automatic gain controller adjusts gain for the last time, read a reference transmit power value from the automatic gain controller, read a gain level from the fixed gain amplifier, and save the reference transmit power value and the gain level in a storage module;

Step 202: Before the fixed gain amplifier is enabled and after the automatic gain controller adjusts gain for the last time, write the reference transmit power value saved in the storage module into the automatic gain controller and write the gain level saved in the storage module into the fixed gain amplifier.

Specifically, according to the characteristic of a QPC technology, a processor may read or write the reference transmit power value and the gain level before the fixed gain amplifier is disabled and enabled, and the characteristic is: when the processor detects that data transmission completes, the processor may immediately disable the fixed gain amplifier on the uplink of a mobile terminal; when the processor detects that data needs to be transmitted, the processor enables the fixed gain amplifier on the uplink again. Therefore, the processor may read the reference transmit power value and the gain level after data transmission completes, and the processor may write the reference transmit power value and the gain level when data needs to be transmitted. However, the embodiment of the present invention is not limited thereto.

In step 201, that before the fixed gain amplifier is disabled and after the automatic gain controller adjusts gain for the last time may be that after the mobile terminal transmits data and the automatic gain controller adjusts gain for the last time. During this period of time, the processor may read the current transmit power value of the mobile terminal from the automatic gain controller, and this transmit power value is a reference transmit power value for a closed-loop feedback loop when the fixed gain amplifier is enabled next time; the processor may further read the gain level from the fixed gain amplifier and save the reference transmit power value and the gain level in the storage module.

Correspondingly, in step 302, before the fixed gain amplifier is enabled and after the automatic gain controller adjusts gain for the last time, the reference transmit power value saved in the storage module is written into the automatic gain controller and the gain level saved in the storage module is written into the fixed gain amplifier. Persons skilled in the art may understand that, in the foregoing steps of writing the transmit power value of the mobile terminal and the gain level, which are read before the fixed gain amplifier is disabled, into the automatic gain controller and the fixed gain amplifier before the fixed gain amplifier is enabled, the automatic gain controller may set the written transmit power value of the mobile terminal as the reference transmit power value for the closed-loop feedback loop.

With the method for quickly power amplifier control provided by the embodiment of the present invention, before the fixed gain amplifier is enabled again, the reference transmit power value and the gain level which are read before the fixed gain amplifier is disabled are written into the fixed gain amplifier and the automatic gain controller, respectively, so that the automatic gain controller and the fixed gain amplifier can recover to the working state before the fixed gain amplifier is disabled. This ensures that in a QPC application, the transmit power when the fixed gain amplifier is disabled is consistent with the transmit power when the fixed gain amplifier is enabled subsequently, and accordingly ensures that the transmit power is consistent and a signal is stable and has good quality on the uplink.

Optionally, the method for quickly power amplifier control provided by the embodiment of the present invention further includes: during the period of time from the time when the fixed gain amplifier is disabled to the time when the fixed gain amplifier is enabled, controlling the automatic gain controller to temporarily stop working.

When being enabled again, the automatic gain controller and the fixed gain amplifier may recover to the original working state. Therefore, during the period of time from the time when the fixed gain amplifier is disabled to the time when the fixed gain amplifier is enabled, the automatic gain controller does not need to work again, and the processor may control the automatic gain controller to temporarily stop working. This meets the energy-saving requirement of the QPC application.

Optionally, before reading the reference transmit power value from the automatic gain controller and reading the gain level from the fixed gain amplifier, the method for quickly power amplifier control further includes:

according to a state flag bit in the fixed gain amplifier, determining whether the fixed gain amplifier is disabled; and if the fixed gain amplifier is not disabled, reading the reference transmit power value from the automatic gain controller and reading the gain level from the fixed gain amplifier.

Specifically, in general, before the reference transmit power value is read from the automatic gain controller and the gain level is read from the fixed gain amplifier, the fixed gain amplifier is enabled; however, in a few cases, the fixed gain amplifier is disabled. This situation may be: when the mobile terminal is transmitting data, because state transition leads to the disabling of the fixed gain amplifier, for example, when the mobile terminal is in data service state, such as surfing the Internet by the mobile terminal, the mobile terminal answers a call, and at this time, the mobile terminal transfers from the data service state to the call answering state, and the disabling of the fixed gain amplifier is controlled by a timer on the uplink, but not controlled by the processor; as a result, the processor cannot read before the fixed gain amplifier is disabled.

Therefore, it is required to determine the state of the fixed gain amplifier. Whether the fixed gain amplifier is disabled can be determined according to the state flag bit in the fixed gain amplifier. The state flag bit may be stored in the state register of the fixed gain amplifier, and enabling and disabling values corresponding to the state flag bit may be preset. The embodiment of the present invention does not specify the values.

Optionally, before writing the reference transmit power value saved in the storage module into the automatic gain controller and writing the gain level saved in the storage module into the fixed gain amplifier, the method for quickly power amplifier control further includes:

according to a state flag bit in the fixed gain amplifier, determining whether the fixed gain amplifier is enabled; and if the fixed gain amplifier is not enabled, writing the reference transmit power value saved in the storage module into the automatic gain controller and writing the gain level saved in the storage module into the fixed gain amplifier.

Specifically, in general, before the reference transmit power value saved in the storage module is written into the automatic gain controller and the gain level saved in the storage module is written into the fixed gain amplifier, the fixed gain amplifier is disabled. However, in a few cases, the fixed gain amplifier is enabled. This situation may be: when the mobile terminal that has transferred from the data service state to the call answering state is transferring from the call answering state back to the data service state, and at this time, the enabling of the fixed gain amplifier is controlled by the timer on the uplink, but not controlled by the processor; as a result, the processor cannot write before the fixed gain amplifier is enabled.

Therefore, it is required to determine the state of the fixed gain amplifier. Whether the fixed gain amplifier is disabled can be determined according to the state flag bit in the fixed gain amplifier. The state flag bit may be stored in the state register of the fixed gain amplifier, and enabling and disabling values corresponding to the state flag bit may be preset. The embodiment of the present invention does not specify the values.

Figure 3:
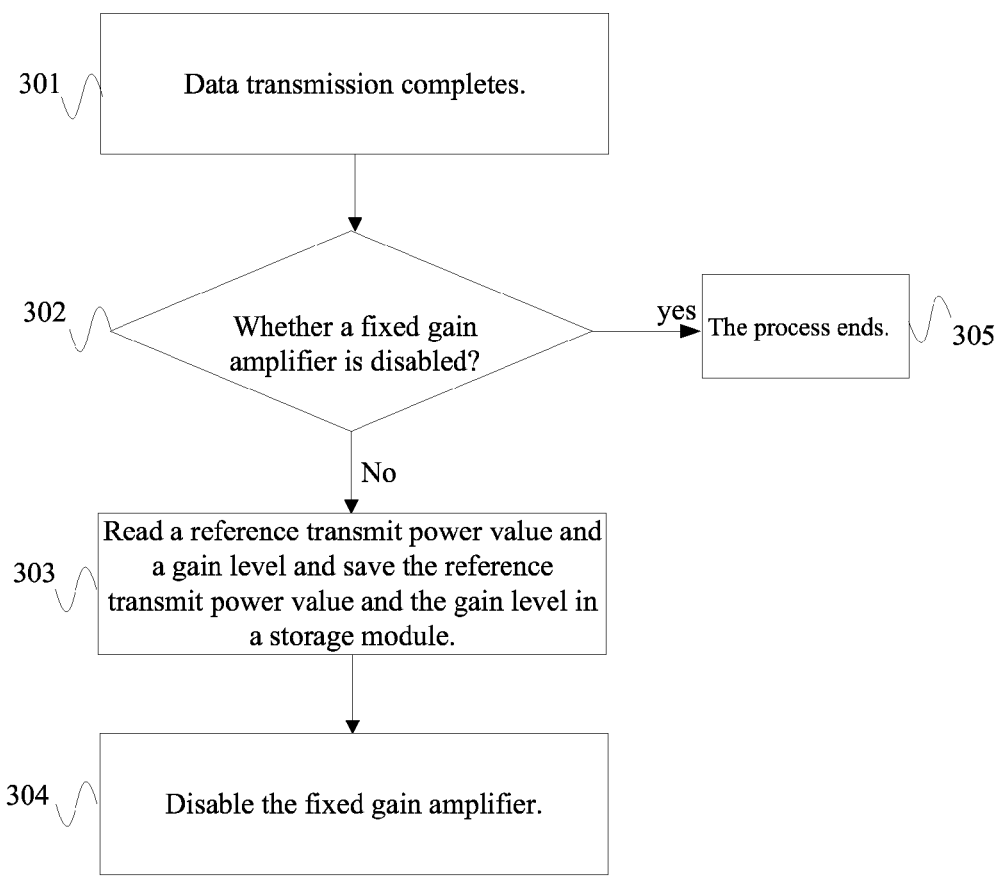
FIG. 3 is a read flowchart of a method for quickly power amplifier control according to an embodiment of the present invention.

FIG. 3 is a read flowchart of a method for quickly power amplifier control according to an embodiment of the present invention. As shown in FIG. 3, the read process includes the following steps:

Step 301: Data transmission completes. That is, a mobile terminal transmits data to a base station, and the data transmission completes.

Step 302: Whether a fixed gain amplifier is disabled, if yes, go to step 305; if no, go to step 303.

Step 303: Read a reference transmit power value and a gain level and save the reference transmit power value and the gain level in a storage module.

Step 304: Disable the fixed gain amplifier.

Step 305: The process ends.

Specifically, in steps 302 to 304, after data transmission completes, if the fixed gain amplifier is not disabled, a processor reads the reference transmit power value from an automatic gain controller and reads the gain level from the fixed gain amplifier and saves them in the storage module before the fixed gain amplifier is disabled and after the automatic gain controller adjusts gain for the last time, and then immediately disables the fixed gain amplifier.

In step 302, if the mobile terminal transfers from a data service state to a call answering state and the mobile terminal stops sending data, the fixed gain amplifier is then disabled. As a result, the gain level fails to be read from the fixed gain amplifier. Therefore, the process ends.

With the process for reading power provided by the embodiment of the present invention, the current transmit power and the gain level can be read and saved before the fixed gain amplifier is disabled, and the gain state on an uplink before the fixed gain amplifier is disabled can be recorded.

Figure 4:
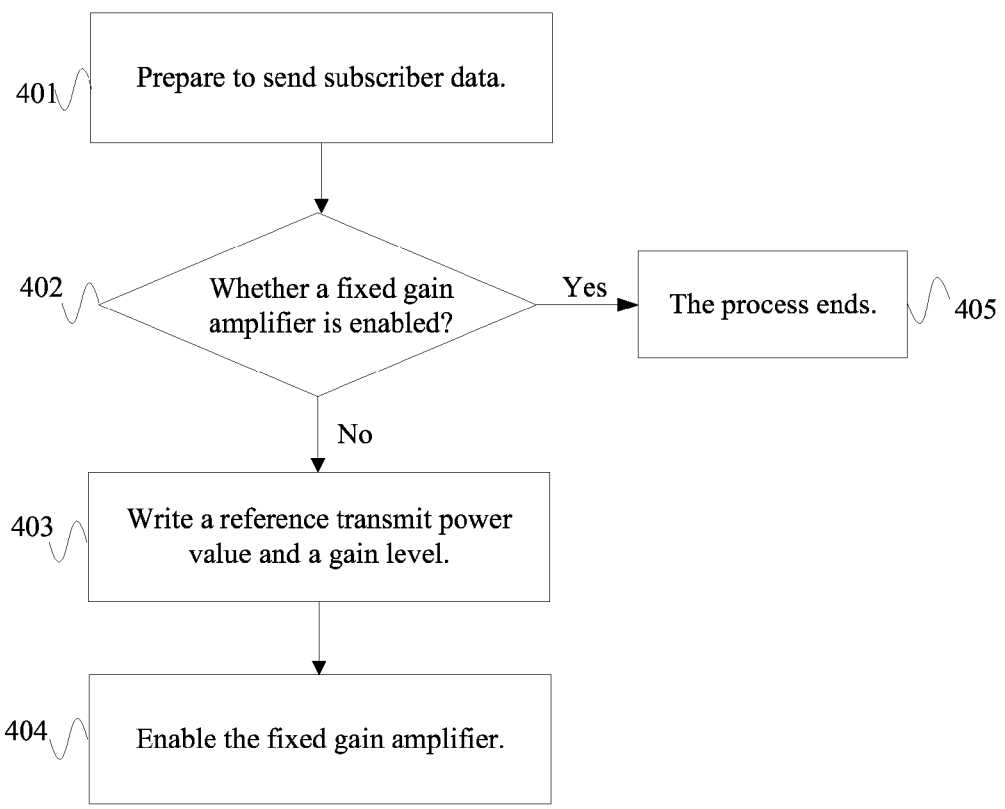
FIG. 4 is a write flowchart of a method for quickly power amplifier control according to an embodiment of the present invention.

FIG. 4 is a write flowchart of a method for quickly power amplifier control according to an embodiment of the present invention. As shown in FIG. 4, the write process includes the following steps:

Step 401: Prepare to send subscriber data. That is, a mobile terminal prepares to send subscriber data to a base station.

Step 402: Whether a fixed gain amplifier is enabled, if yes, go to step 405; if no, go to step 403.

Step 403: Write a reference transmit power value and a gain level.

Step 404: Enable the fixed gain amplifier.

Step 405: The process ends.

Specifically, in steps 402 to 404, when preparing to send subscriber data, a processor writes the reference transmit power value saved in a storage module into an automatic gain controller and writes the gain level saved in the storage module into the fixed gain amplifier, and then immediately enables the fixed gain amplifier.

In step 402, if the mobile terminal transfers from a data service state to a call answering state and then transfers from the call answering state back to the data service state, the mobile terminal starts to transmit data, and the fixed gain amplifier is enabled, where the enabling of the fixed gain amplifier at this time cannot be controlled by the processor, so the processor cannot read the gain level from the fixed gain amplifier, and the process ends.

With the process for writing power provided by the embodiment of the present invention, the reference transmit power value and the gain level before the fixed gain amplifier is disabled are written into a first state register and a second state register, so that the automatic gain controller and the fixed gain amplifier can recover to the working state before the fixed gain amplifier is disabled, thereby ensuring that power when the fixed gain amplifier is disabled is consistent with power when the fixed gain amplifier is enabled again.

Persons of ordinary skill in the art may understand that all or a part of the steps of the methods in the embodiments may be implemented by a program instructing relevant hardware. The program may be stored in a computer readable storage medium. When the program is run, the steps of the forgoing methods in the embodiments are performed. The storage medium includes any medium that is capable of storing program codes, such as a ROM, a RAM, a magnetic disk, or an optical disk.

Finally, it should be noted that the foregoing embodiments are merely intended for describing the technical solutions of the present invention other than limiting the present invention. Although the present invention is described in detail with reference to the foregoing embodiments, persons of ordinary skill in the art should understand that they may still make modifications to the technical solutions described in the foregoing embodiments or make equivalent replacements to some or all of the technical features thereof, without departing from the scope of the technical solutions of the embodiments of the present invention.

What is claimed is:

1. A system for power amplifier control, the system comprising:
an automatic gain controller;
a variable gain amplifier having an input coupled to an output of the automatic gain controller;
a fixed gain amplifier having an input coupled to an output of the variable gain amplifier and having an output coupled to an input of the automatic gain controller;
a radio frequency antenna having an input coupled to the output of the fixed gain amplifier;
a storage module; and
a processor, configured to:
before the fixed gain amplifier is disabled and after the automatic gain controller adjusts gain for a last time, read a reference transmit power value from the automatic gain controller, read a gain level from the fixed gain amplifier, and save the reference transmit power value and the gain level in the storage module; and before the fixed gain amplifier is enabled and after the automatic gain controller adjusts gain for the last time, write the reference transmit power value saved in the storage module into the automatic gain controller and write the gain level saved in the storage module into the fixed gain amplifier.

2. The system according to claim 1, wherein the processor is further configured to control the automatic gain controller to temporarily stop working during a period of time from the time when the fixed gain amplifier is disabled to the time when the fixed gain amplifier is enabled.

3. A method for controlling a power amplifier, the method comprising:

before a fixed gain amplifier is disabled and after an automatic gain controller adjusts gain for a last time, reading a reference transmit power value from the automatic gain controller and reading a gain level from the fixed gain amplifier and saving the reference transmit power value and the gain level in a storage module; and before the fixed gain amplifier is enabled and after the automatic gain controller adjusts gain for the last time, writing the reference transmit power value saved in the storage module into the automatic gain controller and writing the gain level saved in the storage module into the fixed gain amplifier.

4. The method according to claim 3, further comprising controlling the automatic gain controller to temporarily stop working during a period of time from the time when the fixed gain amplifier is disabled to the time when the fixed gain amplifier is enabled.

5. The method according to claim 3, wherein before the reading a reference transmit power value from the automatic gain controller and reading a gain level from the fixed gain amplifier, the method further comprises:

determining whether the fixed gain amplifier is disabled according to a state flag bit in the fixed gain amplifier; and if the fixed gain amplifier is not disabled, reading the reference transmit power value from the automatic gain controller and reading the gain level from the fixed gain amplifier.

6. The method according to claim 3, wherein before writing the reference transmit power value saved in the storage module into the automatic gain controller and writing the gain level saved in the storage module into the fixed gain amplifier, the method further comprises:

determining whether the fixed gain amplifier is enabled according to a state flag bit in the fixed gain amplifier; and if the fixed gain amplifier is not enabled, writing the reference transmit power value saved in the storage module into the automatic gain controller and writing the gain level saved in the storage module into the fixed gain amplifier.

7. A method for controlling a power amplifier, the method comprising:

reading a reference transmit power value from an automatic gain controller;

reading a gain level from a fixed gain amplifier;

saving the reference transmit power value and the gain level in a storage module;

disabling the fixed gain amplifier after saving the reference transmit power value and the gain level in the storage module;

adjusting gain by the automatic gain controller after saving the reference transmit power value and the gain level in the storage module;

after the automatic gain controller adjusts gain for a last time, writing the reference transmit power value saved in the storage module into the automatic gain controller;

after the automatic gain controller adjusts gain for the last time, writing the gain level saved in the storage module into the fixed gain amplifier; and after writing the reference transmit power value and the gain level into the fixed gain amplifier, enabling the fixed gain amplifier.

8. The method according to claim 7, further comprising controlling the automatic gain controller to temporarily stop working during a period of time from the time when the fixed gain amplifier is disabled to the time when the fixed gain amplifier is enabled.

9. The method according to claim 7, wherein before reading the reference transmit power value from the automatic gain controller and reading the gain level from the fixed gain amplifier, the method further comprises:

determining whether or not the fixed gain amplifier is disabled according to a state flag bit in the fixed gain amplifier;

if the fixed gain amplifier is not disabled, reading the reference transmit power value from the automatic gain controller and reading the gain level from the fixed gain amplifier; and if the fixed gain amplifier is disabled, writing the reference transmit power value saved in the storage module into the automatic gain controller and writing the gain level saved in the storage module into the fixed gain amplifier.

* * * * *